United States Patent [19]

Maier

[11] 4,341,730
[45] Jul. 27, 1982

[54] BEAM DANCER FUSION DEVICE

[76] Inventor: Henry B. Maier, 6 Sealey Ave., Hempstead, Long Island, N.Y. 11550

[21] Appl. No.: 148,857

[22] Filed: May 12, 1980

Related U.S. Application Data

[63] Continuation-in-part of Ser. No. 940,332, Sep. 7, 1978, abandoned, and a continuation-in-part of Ser. No. 76,699, Sep. 18, 1979, abandoned, which is a continuation-in-part of Ser. No. 924,386, Jul. 13, 1978, abandoned, which is a continuation-in-part of Ser. No. 773,914, Mar. 3, 1977, Pat. No. 4,137,096.

[51] Int. Cl.$^3$ .............................................. G21B 1/00
[52] U.S. Cl. .................................... 376/103; 376/152
[58] Field of Search ............................ 176/1; 330/4.3; 350/96.10, 96.24; 376/102–104, 151–152

[56] References Cited

U.S. PATENT DOCUMENTS 3,378,446  4/1968  Whittlesey ............................ 176/1
3,613,532 10/1971  Wildhaber ........................ 350/96.10
3,898,587  8/1975  Brinkman, Jr. et al. ............. 330/4.3
3,932,023  1/1976  Humer ............................... 350/96.24
4,078,852  3/1978  Lebduska ......................... 350/96.24

OTHER PUBLICATIONS

Control Nuclear Fusion: Current Research and Potential/Progress, National Academy of Sciences (1978) pp. 7, 14, 15, 33.

Primary Examiner—Sal Cangialosi

[57] ABSTRACT

This invention relates to and comprises materials for fuel elements, and optical and electromagnetic equipment for ignition and maintenance of controlled fusion processes, for use in powering engines and as an energy source for driving electrical generators for electric power stations. Characteristics for commercial development are described. An approach for intensifying the heat of gas flames is also indicated.

4 Claims, 7 Drawing Figures

BEAM DANCER FUSION DEVICE

INTRODUCTION

This is a continuation-in-part patent application to a patent application titled *Concentration and Control Arrangement for Laser Type Energy*, Ser. No. 940,332, Filing Date Sept. 7, 1978 and since abandoned. This is also a continuation-in-part patent application to a patent application titled *Electromagnetic Responding Materials Systems for Energy Production*, Ser. No. 06/076,699, Filing Date Sept. 18, 1979, since abandoned which in turn is a continuation-in-part patent application to a patent application titled *Electroresponsive Coatings*, Ser. No. 924,386, Filing Date July 13, 1878 and since abandoned, and which in turn was a continuation-in-part patent application to a patent titled *Low Cost System for Developing Solar Cells*, Ser. No. 773,914, Filing Date Mar. 3, 1977, and granted to Maier on Jan. 30, 1979 as U.S. Pat. No. 4,137,096.

In the need for developing new energy resources, fusion power ranks, along with solar energy, as one of the few renewable forms of energy, and adaptable for extensive use because of the availability of the fuel material for the fusion processes. Because of this, and due to the possibility that the environmental aspects could be made acceptable, fusion energy prospects—the ignition of a fusion reaction, and its maintenance for practical applications—become matters for premium effort. Unfortunately, such efforts are not rapidly pursued because the methods for fusion ignition elude simple or inexpensive solutions. It is the purpose of this invention to show that the parameters for at least one form of fusion ignition, namely, inertial confinement fusion, and laser fusion in particular, are adaptable to wider degrees of control, with greater chances for success, than have generally been considered. This invention will show how laser fusion probably can be accomplished at an acceptable cost and energy level, making it suitable for commercial applications.

THE NEED FOR A DEEPER ANALYSIS OF THE PROBLEM

Inertial confinement fusion and laser fusion experiments as presently designed and conducted generally have not shown indications of breakthroughs and advances into commercially practical sources of energy for electric power generation and for motive power for transportation systems for the near future. This invention, which is theoretical in nature, will show approaches for design and construction for these types of systems.

Due to the need for large scale funding for a safe and well planned reduction to practice (the cost would be in terms of millions of dollars) operating designs and engineering data cannot be given, since no test model was built. However, it should be obvious to those knowledgeable in the related scientific and engineering areas that the chances for success are possible, and moreover, it should be obvious to those acquainted with the energy crisis, that a sequential, slow series of study, design and test stages to prove the invention, working down from large size prototypes is not suitable. Efforts should go directly into a multifaceted engineering program, to produce a working model of preliminary design. The nature of the energy crisis is such that only one or possibly two decades at the most are available to see a well coordinated program succeed. The need for huge new supplies of energy is apparent.

The reason why prevalent programs do not demonstrate or offer hope for economical production of fusion energy for the near future is due to experimental design. The experiments are planned to demonstrate the attainment of a fusion ignition, not to demonstrate a machine, of moderate size, capable of being connected to an electric generator, or to the propellor of a ship, or to the wheels of a locomotive, and operating by a fusion process as the driving force.

The difference is further evident when it is realized that current experiments generally follow a route of adding greater and greater amounts of laser energy or energizing force carried by particle beams, to finally cause an implosion pellet or fuel target to fuse and release an amount of energy equal to or greater than the amount of energy required for the reaction to take place. The attainment of this breakeven point or cost effectiveness point may take many years to accomplish, and because experiments are designed in a sequential series of efforts, it is at that stage that construction efforts to build a reasonable sized reactor, using less input energy will be made. Such an approach is working from the wrong direction.

The end result should be specified, as engineers and business managers would work, and then the equipment designed and the fusion process planned, to meet these requirements. This type of approach could have a better chance for the attainment of commercially successful systems. It should be considered, that if a huge reactor were to be built, showing cost effectiveness as far as the fusion ignition is concerned, a problem would still remain, in that if the reactor were applied for use as part of a huge central power station design, the transmission lines needed to distribute all of this enormous energy are such that, along with the standby lines needed if the main transmission lines were to fail due to the complex insulation needs and current carrying requirements, the overall system would still be inordinately expensive. Smaller sized reactors, producing lower energy outputs, are much more practical.

THE SOLUTIONS

Energizing beams, moving in upon the fuel target area from many different directions, and in particular, capable of being moved about around the immediate target area during the search for fuel ignition may be the answer.

The use of statically positioned beams, so far, has not proven successful in the search for an energy breakeven point, despite the use of increasingly greater amounts of input energy—quantities of input energy so great, in fact, that it would seem, from simple electromagnetic theory charge calculations, that ample energy has been applied to bring deuterons, at least, together. More than fine focusing of static beams, by means of lenses or curved reflectors is needed.

It would seem that the electrical charge gradient about the atoms or ions comprising the fuel elements is the reason for the inability to produce ease of fusion. It is known that static beams of laser energy directed onto a plasma target are deflected because of the interaction of the electromagnetic property of light and the charge gradient within the plasma. The same type of effect, in a modified form, may therefore exist when the target is a cluster of atoms or ions in an implosion pellet. If this is the reason, then vast increases in the strength of the static beams are necessary just to permit a residual amount of that energy to transfer to the target atoms or ions and force them into a fusion configuration. To overcome such a deflection problem, beams moving about around the target atoms or ions, such as fine, superimposed beams programmed by computer and which, for purposes of definition, we may call 'beam dancing' may give satisfactory results and would be explained as follows:

If two or more fusion fuel elements are in proximity, their fusion may be possible if a suitable threshold value of electromagnetic energy or laser energy could be imparted to the elements, to overcome their natural repulsive forces. Deuterons are an example of fusion fuel elements. However, in addition to the repulsion because of similarly charged elements—as atoms or ions—in regard to considering fusion, the repulsion of the elements with the electric type of field of the electromagnetic energy or laser light itself, causing the fuel to deflect the energy or light must also be overcome. To accomplish this purpose, numerous minute spots of energy or laser light are directed to a micro target area, there to be moved or danced about by a precision mechanical controlling apparatus at the source of the laser light or electromagnetic energy beams, so that merging and coinciding patterns of light or energy beams can occur around the area of the fuel atoms or ions. The projecting of these merging patterns may be considered as target searching techniques to locate responsive clusters of fuel elements and to compress such elements into a condition in which fusion may occur. Computerized programming may be used, to run through a series of constricting ring patterns of light, for example, as the laser beams, up to a thousand or more in number, are brought into focus by incremental superimposition upon each other, or else pass across and out of an area of approximate focus, in either case to impart a sudden coalescing of energy that cannot easily be repelled by the charge of the fusion elements. Opposing forces about the target area would be such that light repelled in one direction would be counterbalanced by repelling forces of light coming from a different direction, to produce a momentary state equivalent to stationary beams, needed to promote the fusion reaction.

The beams of energy or light which may be moved about would be obtained from a branched waveguide system, such as an optical waveguide system or quartz fiber waveguide harness which may be characterized as follows:

In a waveguide system, in particular, in a waveguide system used for supplying energy to induce fusion reactions in a fusion power reactor or fusion electric generating station, or in aiding in ignition and maintenance of fusion reactions of a controlled nature, a method of producing an energy carrying beam or similar energy, such as a laser light beam or electromagnetic beam, gathering said beam in a waveguide, splitting or subdividing said beam into beams of predetermined characteristics and guiding each of said subdivided beams in an individual waveguide, repeating this subdividing procedure as necessary to produce further numbers of split beams; said beam splitting being performed to produce said split beams with characteristics efficiently covering the target area without undue loss of energy beyond the boundary of the target and each being capable of delivering to the target an amount of energy flux which the unsplit beam would deliver; positioning or focusing said subdivided beams at a focal area or volume or reaction site, so that the plurality of coinciding split beams at the focal area or focal volume produce a higher energy flux than would occur from the original laser light or electromagnetic beam, by virtue of the superimposition of one beam image on top of another, and with mechanical or other arrangements such that the beams may be moved about, in and out of focus in a controlled manner, the resultant energy flux being greater at the reaction site volume by the number of coinciding beams which are focused together, than the energy flux of the original unsplit beam.

Another way of explaining this is as follows, and is shown in a representational form by referring to FIGS. 1 through 6 in the drawings, and by the embodiment of an iris focusing control unit, shown in FIG. 7.

Figure 1:
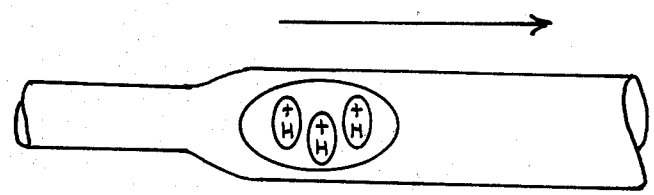
FIG. 1 shows the first possibility, a static energy beam which passes around a fuel cluster, due to charges residing about the cluster.
Figure 2:
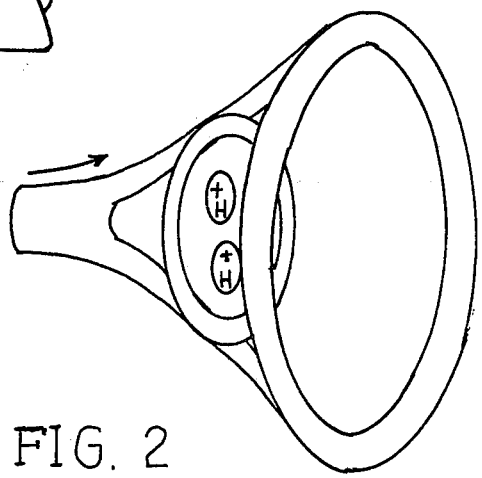
FIG. 2 shows a second possibility, the beam diverges and passes away from the fuel cluster because of the charges of the cluster.
Figure 3:
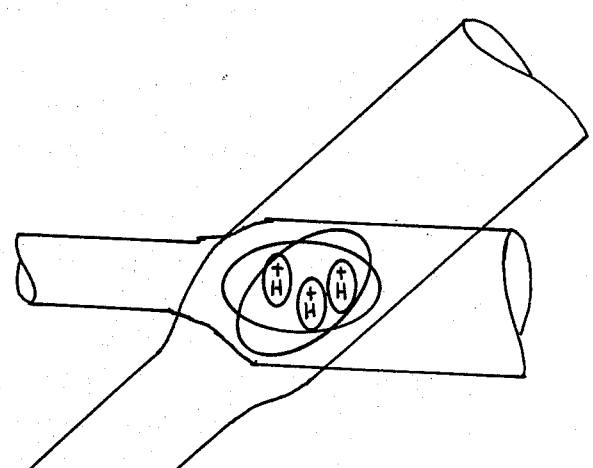
FIG. 3 shows two beams of a static type directed towards a fuel cluster; neither beam imparts energy, but passes around the fuel or else flares away from the fuel.
Figure 4:
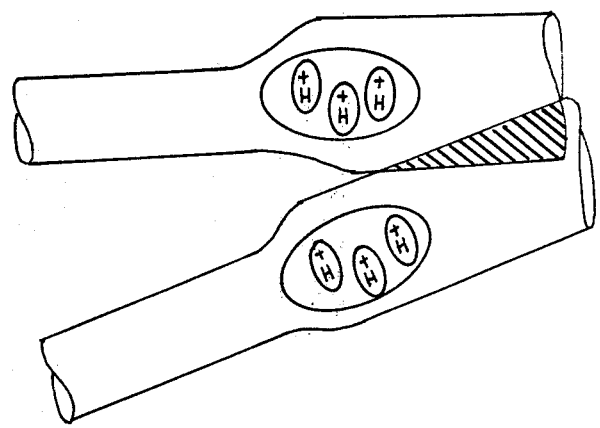

FIG. 4 presents a situation, however, in which two dancing beams diverge simultaneously and then coincide further along to create a reinforcing zone, possibly within an approximate nanosecond time interval, after the two beams had surrounded the two fuel clusters, in the search patterns.

Figure 5:
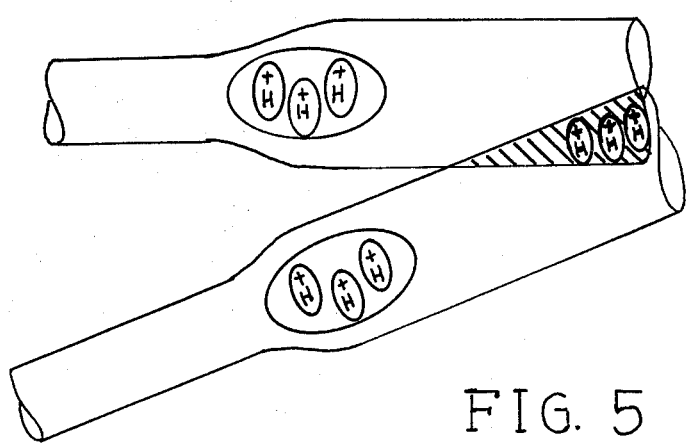

FIG. 5 is the same situation as FIG. 4, except that another fuel cluster has entered the reinforcing zone, or was at the position of the reinforcing zone, at the time it was formed, and this third cluster receives the energy carried by the reinforcing zone.

Figure 6:
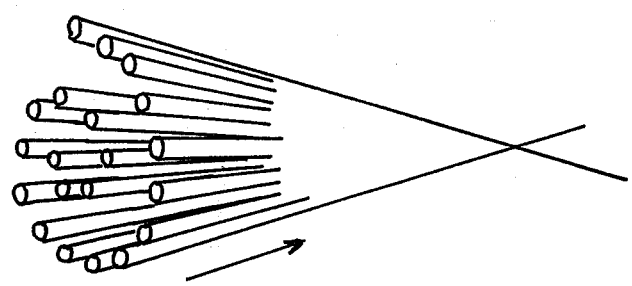

FIG. 6 shows a constricting, helical light beam pattern, possibly suitable for creating reinforcing zones as the focal point moves in and out of focus, while searching for the proper alignment of the fuel clusters.

Figure 7:
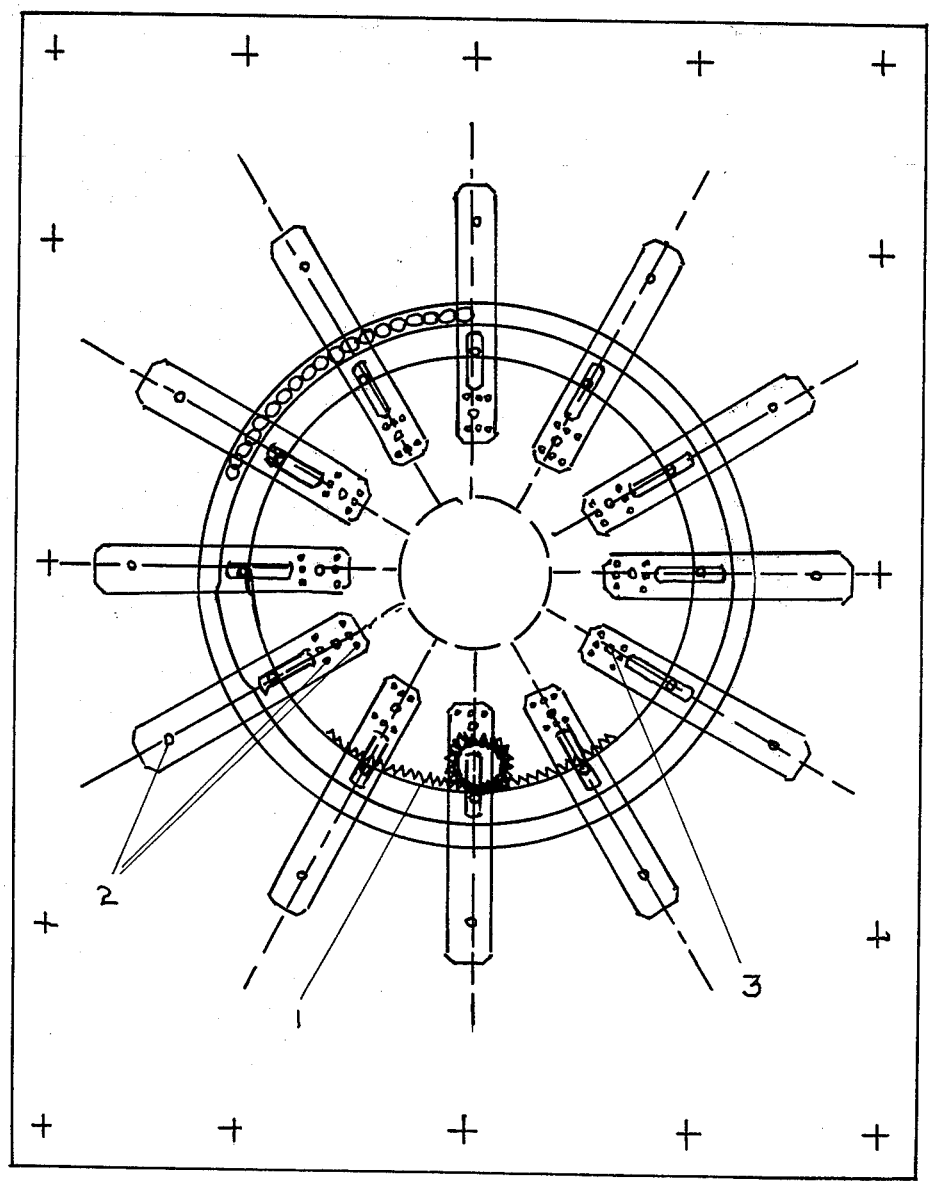

FIG. 7 shows an embodiment of a waveguide iris focusing control ring, operating by a precision gear drive (1) under remote control, in which the individual waveguide fibers, after splitting, are positioned in collars (2) which have previously been adjusted to bring all emerging light from the fibers onto a focal point at the remote target area, during operation of the cam movement with (3) as the pivot point, and in which the entire iris control assembly, together with other assemblies in series, if necessary, may be gimbel mounted and moved about and focusing performed in an arbitrary or in a programmed search pattern about a target area such as an implosion pellet, with search and focusing operating from an automatic, preprogrammed electronic control system, or from a remote control console.

It should also be noted that the use of a waveguide system of subdividing branches is an economy measure to permit a laser light level of lower input energy, by making more efficient use of the input energy, since the waveguide assembly can provide a fine degree of focus, as well as allow target seeking techniques to aid in promoting the fusion reactions.

The fuel material for the laser fusion process contemplated for this invention should have acceptable levels of hazardous by-products, which, ideally, would mean zero levels of hazardous by-products, but if this requires holding up the development of the end result, namely, an engine operating by the fusion process, to help alleviate the energy crisis, then if a fuel composition is available which produces radioactivity so low that it is easily contained and dissipates within a few days to zero level, such fuel may be used temporarily. If this fuel material is not available, then study and development should continue until a safe implosion pellet or fuel system can be devised.

Hydrogen is a possible fuel element, so is deuterium, which is easier to fuse, and tritium, which is still easier to use in producing fusion processes, but tritium also produces radioactive by-products and therefore should be eliminated from consideration. Deuterium, in combination with other elements, may or may not be satisfactory, but if deuterium or hydrogen are selected, a desirable feature of their use in a fuel pellet is to have their atomic spacing as close together as possible, to make it easier to bring them into a fusion configuration under the influence of laser light or beams such as particle or ion beams.

To contain hydrogen or deuterium, or both, in a solid state would help to minimize the interatomic distances, as compared to the gaseous or liquid states. Hydrogen or deuterium would occur in the gaseous state, or, combined with oxygen, in the liquid state. Freezing these materials to very low temperatures to form solids means that storage and use requirements are complicated, and for a commercial process, this is not a good system. The material should be contained at room temperature in a solid form. This difficult feat may be accomplished by coprecipitating the elements, along with other suitable elements, from a bath containing multi-valent ions such as sulfate ions. Formation, for example, of salts such as sodium acid sulfate or sodium bisulfate, or complex or hydrated crystals would produce a solid crystal containing the desired elements and result in a composition which may be suitable for use directly or indirectly as a fusion implosion pellet.

The composition of the fusion implosion pellet should not contain elements which are toxic since the gaseous residue which results when vaporization occurs during the fusion ignition could produce a build up of toxic fumes or deposits. Heavy metal salts would not be desirable.

A study of the literature for fusion energy may aid in selecting materials which might be suitable for the pellet compositions, even though higher levels of laser or beam energy may be required, than for those compositions containing tritium.

In the course of the laboratory development of fuel pellets for various types of fusion engines, design modifications of the pellets will be necessary since some engines may require pellets releasing large amounts of heat when ignited by the laser input, while other engines, particularly multicylinder engines firing in sequence, will require smaller individual releases of energy per cylinder because the overall cycle for all the cylinders requires a total energy summation to provide equivalent power for a given engine work load. Also, some pellets may have to meet standards in which their costs are minimal, while other pellets, possibly more efficient or more easily ignited, may be more expensive due either to costlier ingredients or more complex methods of manufacture.

To aid in the development of the desired pellet types the following checkpoints should be considered in planning the thermodynamics and physical characteristics:
1. Types of pellets for possible use.
2. Practical limitations on choice of materials.
3. Materials available for design study.
4. Methods of laser fusion ignition.
5. Types of explosion patterns.
6. An implosion as the start of the ignition.
7. Conversion of the implosion to the explosive release of energy.
8. Materials structures to relate to the required energy release patterns.
9. Possible pellet compositions for required energy release patterns.
10. Methods of manufacture to provide desired compositions.

An example of a process for preparing fusion ignition pellets for testing is here given but it must be emphasized, this pellet type has not been tested, and cannot be tested unless facilities assuring complete safety of results are constructed. Any pellet type must be tested with extreme caution because radioactive by-products, x-rays or shock waves, and intense heat or light could occur and spread into parts of the test facility. Mere placing of barriers between the ignition site and the workers is not sufficient protection. Also, theoretical calculations to determine the possible energy releases are helpful, but the actual energy releases, if they do occur, are probably too complex to completely predict in advance. For this reason, pellets of the lowest energy output should be tested first, before scaling up for later experiments.

PROCESS FOR PREPARING PELLET, TYPE NO. 1

This procedure may require modification of the formula concentrations, particularly the amount of deuterium sulfate added, depending upon the power levels of the laser ignitors used, and this would be based upon experimental findings. The pellet is designed for use in heat exchange cylinders four to six feet in internal diameter, firing at a rate of one pellet at intervals of not less than ten seconds each.

STEP I

Dissolve proper quantities of chemically pure potassium sulfate, sodium sulfate, or both, in distilled, deionized water to form a saturated solution at an elevated temperature. Add sufficient deuterium sulfate solution and allow crystallization to take place over a period of time at a lower temperature. Maintain a record of all conditions in a notebook, to allow reproducing the exact results at a later time, if more batches are needed.

Decant the solution and filter off and retain the crystal precipitate. Discard the filtrate and decanted solution for disposal under controlled conditions. Allow the precipitate to air dry.

STEP II

Mix proper quantities of the following chemically pure materials: sodium thiosulfate, ferrous sulfate and zinc sulfate. Dissolve in sufficient quantity of distilled, deionized water to form a saturated solution at an elevated temperature. Add proper amount of the dried precipitate crystals from Step I, heating as required to dissolve all materials. Slowly add, in small increments, chemically pure red iron oxide powder, over a period of time and at a lower temperature, stirring as required until a paste is formed. Spread paste on glass plates and place in dessicator chamber to dry.

STEP III

When paste has dried to the correct degree of moisture content, either pack the powder into small plastic spheres, using capsule filling equipment properly modified for the purpose, or else compress the powder into spherical or other suitable type of pellet shape. Store the pellets in a dry container until ready for use as implosion pellets for fusion fuel.

NOTES

The process just described may be modified so that the paste from Step II may be used to coat the crystals from Step I, to obtain a different type of implosion pattern, or the entire procedure may be modified by substituting or adding other materials, while retaining the same general procedure. The basic procedure described should provide a pellet in which a shower of electron release occurs within the pellet when energized by laser light, to aid in possible fusion ignition under controlled conditions.

While the operation of the laser beam ignitors or the electromagnetic beam ignitors, and the fusion fuel materials, as previously described, are intended for direct fusion energy release, an interesting variation might be the application to the intensification of heat output from a gas flame by metering into the inner or outer cone of the flame small amounts of fusion fuel material and igniting to obtain a higher temperature flame than would otherwise result.

From all of the formerly described information, it should be obvious that this invention represents a major advance in the area of energy resources, and the applications of the invention should be evident to those skilled in the art.

What I claim as new, and desire to have secured by Letters Patent is:

1. A fusion device comprising
   (a) an energy input device
   (b) an optical waveguide system including at least one first main waveguide having an input end and output end, a plurality of second branched waveguides having input ends and output ends, means for coupling the input end of said first main waveguide to said energy input device, means for coupling the input ends of said plurality of second branched waveguides to the output end of said main waveguide, the diameter of said first main waveguide being substantially larger than the diameter of a single one of said second branched waveguides;
   (c) mechanical means for moving the output ends of said plurality of second branched waveguides;
   (d) means for establishing a focal point, said mechanical means directing the output ends of said plurality of second branched waveguides to said focal point;
   (e) a target including a fusion fuel and a thiosulfate salt, positioned at said focal point, wherein upon activation of the energy input device an energy irradiation is produced at the focal point which then comprises a superimposition of energy flux on the target surface from the mechanical movement of the output ends of said second branched waveguides during irradiation.

2. The system as claimed in claim 1, in which said main and branch waveguides comprise fiber optics.

3. The system as claimed in claim 1, in which two or more waveguides are arranged in sequence and wherein the energy input device includes a laser means.

4. The system as claimed in claim 1, in which the output energy at the focal point or target area energizes a fusion fuel material produced from mixtures comprising zinc, iron, sulfur, oxygen and hydrogen, in selected combinations.

* * * * *